(12) United States Patent
Mathai et al.

(10) Patent No.: US 8,934,745 B2
(45) Date of Patent: Jan. 13, 2015

(54) APPARATUS FOR USE IN OPTOELECTRONICS HAVING A SANDWICHED LENS

(75) Inventors: Sagi Varghese Mathai, Berkeley, CA (US); Michael Renne Ty Tan, Menlo Park, CA (US); Paul Kessler Rosenberg, Sunnyvale, CA (US); Wayne Victor Sorin, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 57 days.

(21) Appl. No.: 13/563,135

(22) Filed: Jul. 31, 2012

(65) Prior Publication Data

US 2014/0037247 A1 Feb. 6, 2014

(51) Int. Cl.
| | |
|---|---|
| G02B 6/26 | (2006.01) |
| G02B 6/42 | (2006.01) |
| H01L 31/0232 | (2014.01) |
| G02B 6/12 | (2006.01) |
| H01L 25/16 | (2006.01) |

(52) U.S. Cl.
CPC ............ *G02B 6/4228* (2013.01); *G02B 6/4206* (2013.01); *G02B 6/4246* (2013.01); *H01L 31/0232* (2013.01); *G02B 6/4292* (2013.01); *G02B 6/12* (2013.01); *H01L 31/02327* (2013.01); *G02B 6/42* (2013.01); *H01L 25/167* (2013.01); *G02B 6/4204* (2013.01)
USPC .................... 385/52; 385/14; 385/15; 385/53; 385/60

(58) Field of Classification Search
CPC .......... G02B 6/12; G02B 6/42; G02B 6/4292; G02B 6/4246; G02B 6/4204; H01L 25/167; H01L 31/0232; H01L 31/02327
USPC ....................................................... 385/14–94
See application file for complete search history.

(56) References Cited

U.S. PATENT DOCUMENTS

| | | | |
|---|---|---|---|
| 5,195,150 A * | 3/1993 | Stegmueller et al. ........... | 385/33 |
| 6,267,515 B1 * | 7/2001 | Okuda et al. .................... | 385/88 |
| 6,527,455 B2 | 3/2003 | Jian | |
| 6,900,509 B2 * | 5/2005 | Gallup et al. .................. | 257/414 |
| 6,910,812 B2 * | 6/2005 | Pommer et al. ................. | 385/92 |
| 6,981,804 B2 * | 1/2006 | Jian ................................. | 385/88 |
| 7,251,398 B2 | 7/2007 | Baets et al. | |
| 7,413,917 B2 * | 8/2008 | Gallup et al. ................... | 438/27 |

(Continued)

OTHER PUBLICATIONS

Beier, A. et al., "Electro-optical circuit boards using thin-glass sheets with integrated optical waveguides", http://144.206.159.178/ft/CONF/16411697/16411723.pdf, 2008.

(Continued)

*Primary Examiner* — Ryan Lepisto
*Assistant Examiner* — Guy Anderson

(57) ABSTRACT

According to an example, an apparatus for use in optoelectronics includes a bottom transparent layer, a top transparent layer having a top surface, a lens sandwiched between the bottom transparent layer and the top transparent layer, and a first alignment element attached to the top surface of the top transparent layer, wherein the first alignment element is offset with respect to the lens and is to mate with a mating alignment element on an optical transmission medium.

17 Claims, 5 Drawing Sheets

(56) References Cited

U.S. PATENT DOCUMENTS

| | | | |
|---|---|---|---|
| 7,961,989 B2* | 6/2011 | Kathman et al. | 385/14 |
| 2005/0063648 A1* | 3/2005 | Wilson et al. | 385/90 |
| 2011/0042770 A1* | 2/2011 | Brady | 257/432 |
| 2013/0279842 A1* | 10/2013 | Gary et al. | 385/14 |

OTHER PUBLICATIONS

Brusberg, L. et al., "Thin Glass Based Packaging Technologies for Optoelectronic Modules", http://ieeexplore.ieee.org/xpl/login.jsp?tp=&arnumber=5074018, Dec. 3, 2009.

* cited by examiner

APPARATUS FOR USE IN OPTOELECTRONICS HAVING A SANDWICHED LENS

BACKGROUND

Optical engines are commonly used to transfer electronic data at high rates of speed. An optical engine includes hardware for converting electrical signals to optical signals. The hardware may include a light source, such as a laser device, that outputs light into an optical transmission medium, such as a waveguide or fiber optic cable, which transports the optical signals to a destination. Accurate alignment between the light source and the optical transmission medium is required to enable effective communication of the optical signals from the light source to the optical transmission medium.

Conventionally, light sources are coupled to optical transmission media through a process known as active alignment. Active alignment typically involves energizing a light source and using a lens system to direct light from a light source into an optical transmission medium. Active alignment utilizes a feedback signal to adjust the physical location of key components. As such, active alignment is known to be tedious, time consuming, and costly.

BRIEF DESCRIPTION OF THE DRAWINGS

Elements of the present disclosure are illustrated by way of example and not limited in the following figure(s), in which like numerals indicate like elements, in which.

DETAILED DESCRIPTION

Figure 1:
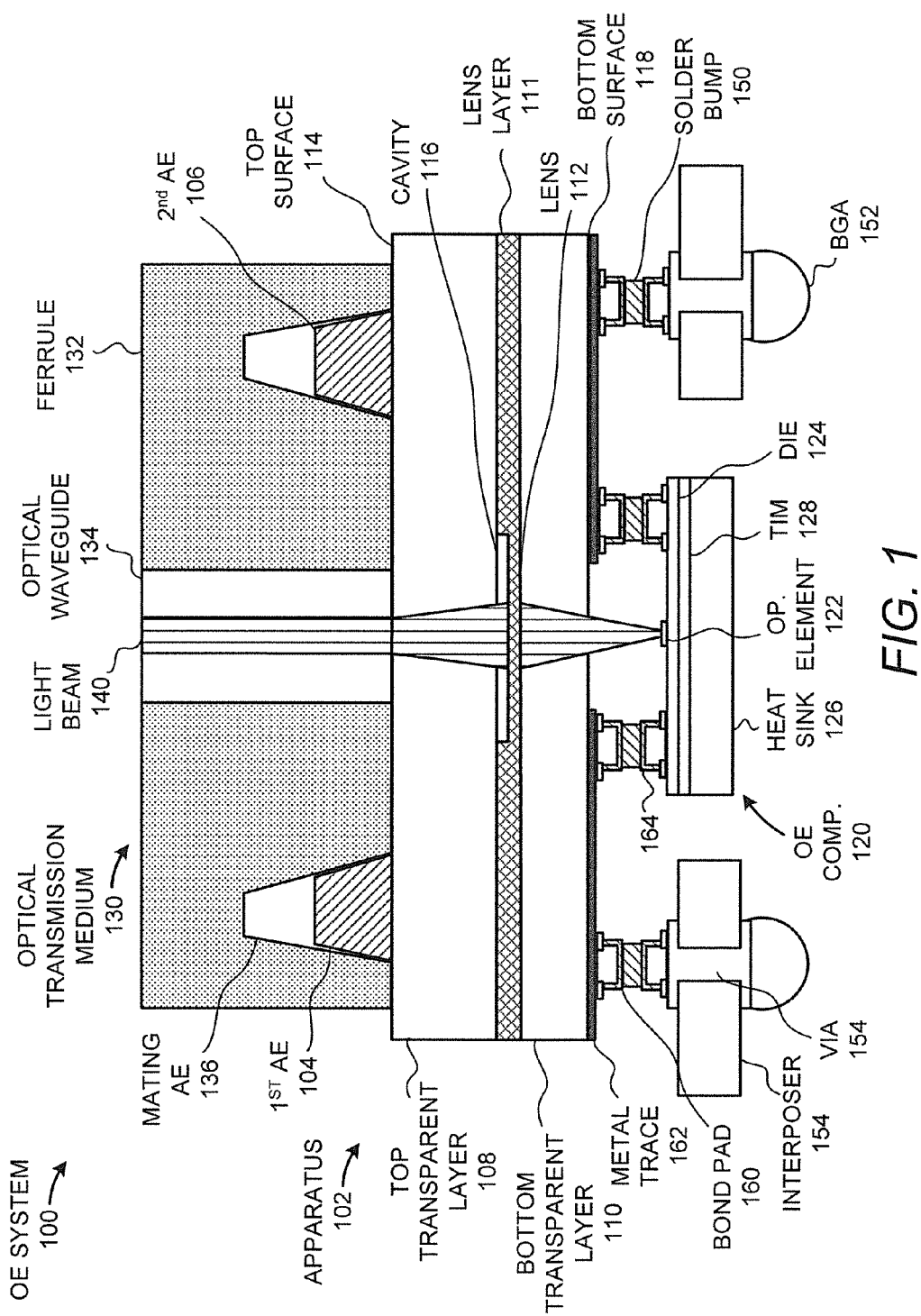
FIG. 1 shows across-sectional side view of an optoelectronic system, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on. In addition, the term "optoelectronic component" refers to an optical source device, such as, a laser, an optical receiver device, such as, a detector, an optical modulator, such as an electro-optic modulator, or a combination of an optical source device and/or a modulator, and an optical receiver device, such as, a transceiver. Moreover, the term "optical element" refers to the actual part of the optoelectronic component that emits, modulates, and/or senses light. Furthermore, the term "light" refers to electromagnetic radiation with wavelengths in the visible and non-visible portions of the electromagnetic spectrum, including infrared and ultra-violet portions of the electromagnetic spectrum.

Disclosed herein are an apparatus for use in optoelectronics, a method for fabricating the apparatus, and an optoelectronic (OE) system. The apparatus includes a lens that is protected from the environment by being sandwiched or buried between adjacent layers of transparent material, such as glass. The layers of transparent material seal the lens within a cavity to keep the lens free of debris and therefore clean. In addition, the layers of transparent material provide a robust structure that is easily cleanable, in that the layers of transparent material include substantially planar surfaces, i.e., through wiping of the surfaces.

The apparatus also includes bond pads that are precisely aligned with the lens such that an optical element of an OE component is aligned with the lens when the OE component is attached to the bond pads. In addition, the apparatus includes an alignment element that is to mate with a mating alignment element on an optical transmission medium, such that mating of the alignment elements causes an optical waveguide in the optical transmission medium to precisely align with the lens and therefore the optical element of the OE component. As such, the optical element may be passively aligned with the optical waveguide through use of the apparatus disclosed herein.

Passive alignment is generally simpler and less costly to implement than active alignment, which is discussed above. In one regard, passive alignment does not require energizing the optoelectronic component when coupling the optical transmission medium to the optoelectronic component.

Through use of the apparatus, method, and system described herein, optoelectronic components, such as source devices, receiving devices, and transceiver devices, may effectively be coupled to an optical transmission medium without the use of active alignment systems and techniques. In addition, the apparatus may be fabricated using wafer scale technologies and the alignment elements and the bond pads may be patterned onto the apparatus. Thus, the coupling may be achieved efficiently at a relatively low cost. Additionally, more optical connections may be fit into a smaller space, thus providing a more efficient use of chip space. Furthermore, the transparent layers of the apparatus may be CTE matched to the optoelectronic component, which mitigates stress issues that may arise between the apparatus and the optoelectronic component.

FIG. 1 shows across-sectional side view of an optoelectronic (OE) system 100, according to an example. It should be understood that the OE system 100 depicted in FIG. 1 may include additional components and that some of the components described herein may be removed and/or modified without departing from a scope of the OE system 100. It should also be understood that the components depicted in FIG. 1 are not drawn to scale and thus, the components may have different relative sizes with respect to each other than as shown therein.

The OE system 100 is depicted as including an apparatus 102, an OE component (comp.) 120, an optical transmission medium 130, a ball grid array (BGA) 152, and an interposer 154. The OE component 120 is depicted as including an optical (OP.) element 122 positioned on a die 124, a heat sink 126, and a thermal interface material (TIM) 128 positioned between the die 124 and the heat sink 126. As shown in FIG. 1, and according to an example, the optical element 122 generates a light beam 140, which may comprise a laser beam. In this example, the die 124 may comprise a laser source, such as, a vertical-cavity surface-emitting laser (VCSEL), a light emitting diode (LED), etc. In another example, the optical element 122 receives a light beam 140. In this example, the die 124 may comprise an optical receiver, such as a photodetector. In another example, the optical element 122 may be a combination light source and external modulator, such as an electro-optic modulator.

The optical transmission medium 130 is depicted as comprising a ferrule 132, an optical waveguide 134, and mating alignment elements (AEs) 136. The ferrule 132 generally protects the optical waveguide 134 and contains the mating alignment elements 136. The optical waveguide 134 may comprise any suitable media through which light beams 140 may be transmitted.

Although the mating alignment elements 136 have been depicted as comprising holes, it should be understood that the mating alignment elements 136 may comprise any other configuration that is suitable for mating with mating elements of the apparatus 102. In this regard, the configurations of the mating alignment elements 136 may be selected such that the mating alignment elements 136 respectively mate with a first mating alignment element 104 and a second mating alignment element 106 of the apparatus 102. In addition, although the mating alignment elements 136 have been depicted as being integrally formed into the ferrule 132, the mating alignment elements 136 may alternatively be formed in a separate element that is attached to the optical transmission medium 130.

The apparatus 102 is depicted as including the first alignment element ($1^{st}$ AE) 104, the second alignment element ($2^{nd}$ AE) 106, a top transparent layer 108, a bottom transparent layer 110, and a lens 112. The first alignment element 104 and the second alignment element 106 are depicted as being positioned on the top surface 114 of the top transparent layer 108. Particularly, the first alignment element 104 and the second alignment element 106 are adhered, bonded, or otherwise attached to the top surface 114. In addition, the first alignment element 104 and the second alignment element 106 are depicted as being positioned on the top transparent layer 108 to mate with mating alignment elements 136 in the ferrule 132. The connection between the first and second alignment elements 104, 106 and the mating alignment elements 136 enables passive alignment of the optical element 122 and the optical waveguide 134 as discussed in greater detail below.

The first alignment element 104 and the second alignment element 106 may be formed through various fabrication processes, including, for instance, imprinting, molding, photolithography, electroplating, etc., that enables the first alignment element 104 and the second alignment element 106 to be physically attached to the top surface 114. The first alignment element 104 and the second alignment element 106, for instance, if made of photoresist, may be covered with a metallic cap (not shown) to add strength and stability to the first alignment element 104. The metallic cap may be formed by, for example, ebeam evaporation, sputtering, electroplating, etc. As another example, the first alignment element 104 and the second alignment element are 106 made of a semiconductor material, such as silicon. In this example, the silicon maybe wafer-bonded to the top surface 114 of the top transparent layer 108. Because of the manufacturing techniques involved, the first alignment element 104 and the second alignment element 106 made of silicon may be constructed to increased dimensions to generally improve the alignment properties of the first alignment element 104 and the second alignment element 106. Various other examples with respect to the first alignment element 104 and the second alignment element 106 are described in greater detail herein below.

Because the first alignment element 104 and the second alignment element 106 may be constructed out of photoresist, such as SU-8, or silicon, construction is relatively simple and inexpensive. Such construction allows for alignment elements with simple and complex shapes to be fabricated at the wafer scale. This reduces the time and cost involved in manufacturing the apparatus 102 and similarly reduces the cost of optoelectronic communication.

Figure 2A:
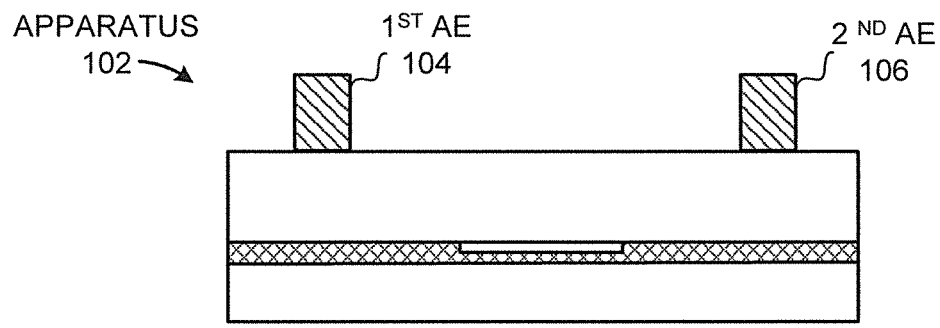
FIGS. 2A-2C, respectively, show cross-sectional side views of an apparatus depicting various alignment element configurations, according to examples of the present disclosure.
Figure 2B:
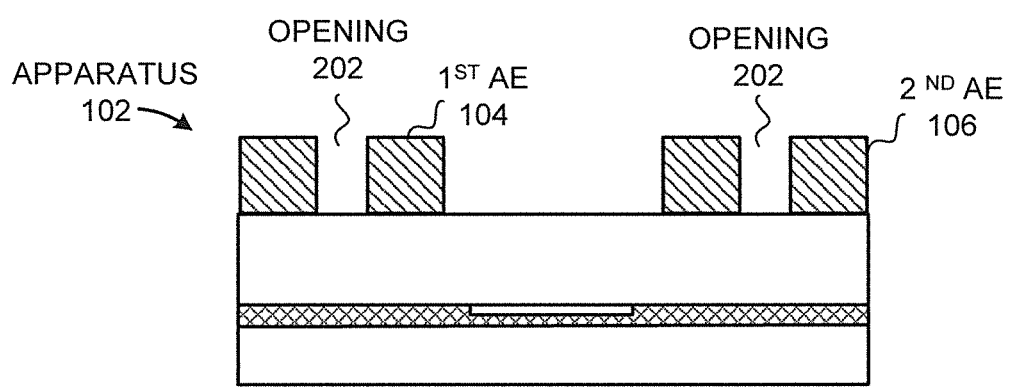
Figure 2C:
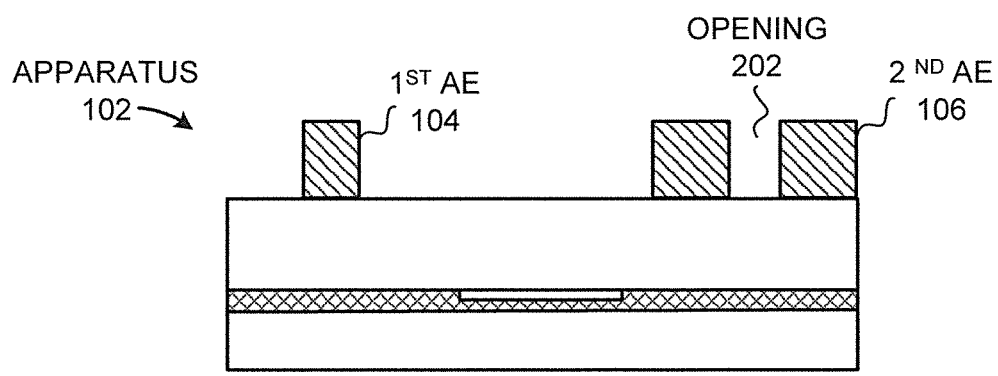

Although the first alignment element 104 and the second alignment element 106 have been depicted in FIG. 1 as having a tapered configuration, it should be clearly understood that the first alignment element 104 and the second alignment element 106 may have other configurations without departing from a scope of the apparatus 102 disclosed herein. Examples of some other configurations are depicted in FIGS. 2A-2C. With reference first to FIG. 2A, the first alignment element 104 and the second alignment element 106 are depicted as having rectangular cross-sectional configurations. In this example, the mating alignment elements 136 in the ferrule 132 may also have corresponding rectangular cross-sectional configurations into which the rectangular-shaped first alignment element 104 and the second alignment element 106 are to be inserted.

With reference to FIG. 2B, the first alignment element 104 is depicted as having an opening 202 around which material forming the first alignment element 104 is positioned. In this regard, the first alignment element 104 comprises a female-type of connector. That is, for instance, the first alignment element 104 comprises an annular shape. The second alignment element 106 comprises a similar configuration to the first alignment element 104. In this example, the mating alignment elements 136 in the ferrule 132 comprise male-type connectors that are to be inserted into the openings 202. The openings 202 may also have an inverted tapered configuration to enable the mating alignment elements 136 to relatively easily be inserted into the openings 202.

With reference to FIG. 2C, the first alignment element 104 is depicted as having a male-type connector configuration and the second alignment element 106 is depicted as having a female-type connector configuration. In this regard, FIG. 2C depicts a configuration in which the first alignment element 104 and the second alignment element 106 form a hermaphroditic arrangement. In this example, one of the mating alignment elements 136 in the ferrule 132 will have a female-type connector configuration and another one of the mating alignment elements 136 will have a male-type connector configuration.

The first alignment element 104 and the second alignment element 106 may comprise other physical characteristics. For instance, sharp corners of the alignment elements 104, 106 may be smoothed through, for instance, reflow, thermally oxidizing, and wet etching the alignment elements 104, 106. As another example, the alignment elements 104, 106 may be oxidized or coated with a metal to form a relatively hard, for instance, non-chipping, surface. As a further example, the alignment elements 104, 106 may be coated with Teflon™, Dicronite, or similar low friction coating to facilitate mating with a respective mating alignment element 136. As another example, the alignment elements 104, 106 may comprise electroplated metal to form a relatively robust surface.

With reference back to FIG. 1, the lens 112 is depicted as being buried within a cavity 116 between the top transparent layer 108 and the bottom transparent layer 110. Generally speaking, the lens 112 is to focus light beams 140 emanating from or being directed to the optical element 122. The lens 112 may have relatively precise features and may need to remain free of dust or other particles to operate efficiently and accurately. In one regard, by burying and sealing the lens 112 within the cavity 116, which may completely surround the lens 112 thus enclosing the lens in an air-tight or substantially air-tight enclosure, the lens 112 is substantially protected from the environment. In addition, the top surface 114 of the top transparent layer 108 and the bottom surface 118 of the bottom transparent layer 110, which generally comprise planar surfaces, may easily be cleaned.

The top transparent layer 108 and the bottom transparent layer 110 comprise any suitable optically transparent material, such as, glass, plastic, etc., that may be relatively easily cleaned. According to an example, the top transparent layer 108 and the bottom transparent layer 110 are formed of a material in which the coefficient of thermal expansion (CTE) is matched with that of the optoelectronic component 120. In addition, the top transparent layer 108 and the bottom transparent layer 110 have a combined height greater than about 500 microns. The combined height of the top transparent layer 108 and the bottom transparent layer 110 may also be less than about 2 mm. Moreover, the first alignment element 104 and the second alignment element 106 may have heights in the range of about 200 microns to 1 mm or more.

The top transparent layer 108 and the bottom transparent layer 110 may be bonded together through use of any suitable transparent adhesive material or other processes, such as application of heat, use of mechanical fasteners, wafer bonding, etc., that maintain transparency in the interface between the top transparent layer 108 and the bottom transparent layer 110. As shown in FIG. 1, a lens layer 111 containing the lens 112 is positioned between the top transparent layer 108 and the bottom transparent layer 110. According to an example, the lens layer 111 comprises a suitable material into which the lens 112 may be fabricated, for instance, of polymer, solid glass, $SiO_2$ thin films, etc. In any regard, the lens layer 111 may be sandwiched between the top transparent layer 108 and the bottom transparent layer 110 and maintained in that position through use of any of the suitable materials, fasteners, and/or processes discussed above.

In other examples, however, the top transparent layer 108 may be positioned in direct contact with the bottom transparent layer 110. In these examples, the cavity 116 may be formed in either or both of the top transparent layer 108 and the bottom transparent layer 110 or in a separate intermediate layer positioned between the top transparent layer 108 and the bottom transparent layer 110. In addition, instead of being formed in the lens layer 111, the lens 112 may be performed directly on one of the top transparent layer 108 and the bottom transparent layer 110 or may be formed on a separate substrate, such as a polymer substrate, formed on top of the bottom transparent layer 110 or the bottom of the top transparent layer 108. In any regard, the lens 112 may be formed through various suitable processes, including etching, reflow, stamping, etc. Various examples of other configurations for the lens 112 and the cavity 116 are depicted in FIGS. 3A-3D. Although particular example configurations are depicted in FIGS. 3A-3D, it should be clearly understood that other configurations are possible without departing from a scope of the apparatus 102 disclosed herein.

Figure 3A:
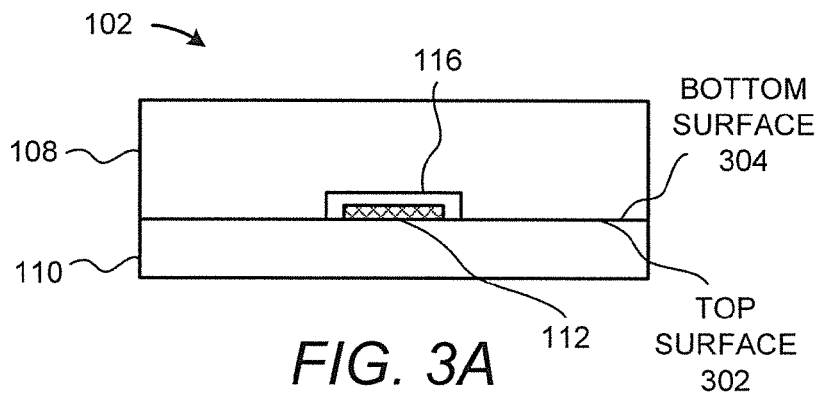
FIGS. 3A-3D, respectively, show cross-sectional side views of an apparatus depicting various lens and cavity configurations, according examples of the present disclosure.
Figure 3B:
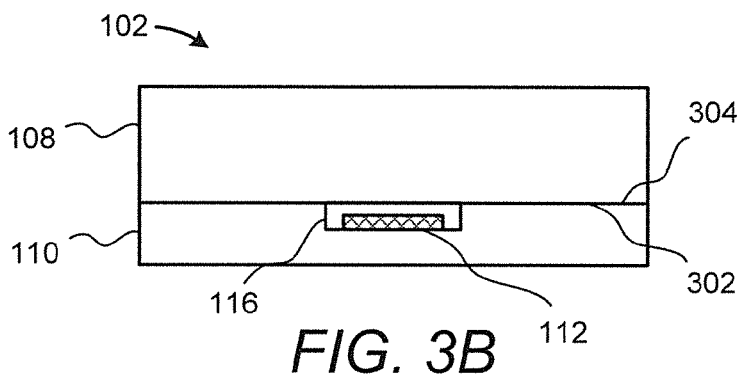
Figure 3C:
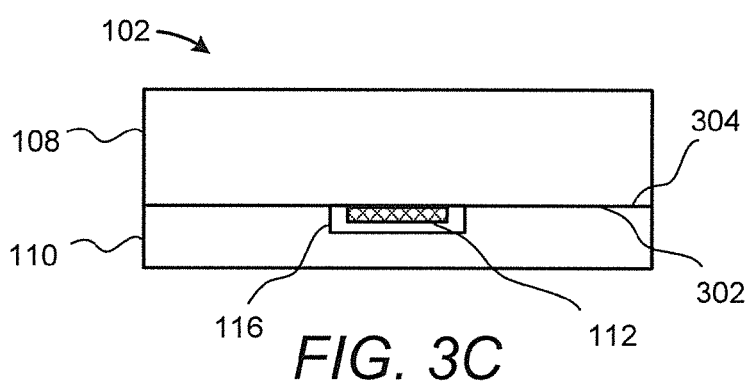
Figure 3D:
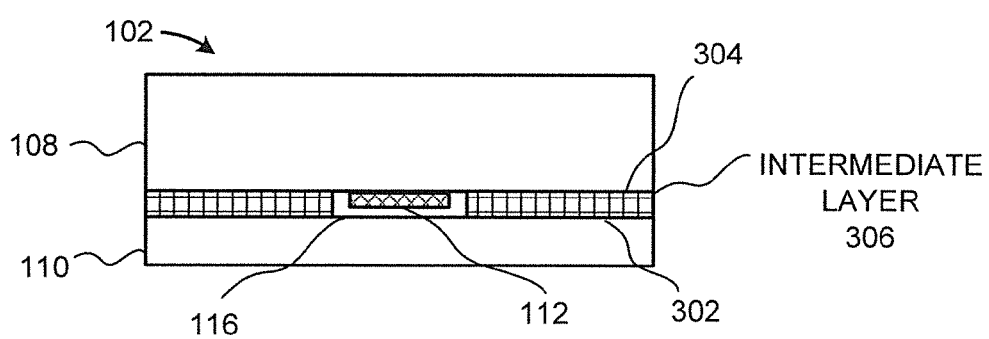

With reference first to FIG. 3A, the cavity 116 is depicted as being formed in the top transparent layer 108. In addition, the lens 112 is depicted as being positioned on a top surface 302 of the bottom transparent layer 110. In FIG. 3B, the cavity 116 is depicted as being formed in the bottom transparent layer 110. In addition, the lens 112 is depicted as being positioned on a bottom surface of the cavity 116. In FIG. 3C, the cavity 116 is depicted as being formed in the bottom transparent layer 110 and the lens 112 is depicted as being positioned on a bottom surface 304 of the top transparent layer 108. In FIG. 3D, the cavity 116 is depicted as being formed in an intermediate layer 306 and the lens is depicted as being positioned on the bottom surface 304 of the top transparent layer 108. According to an example, the intermediate layer 306 comprises a thin film layer, such as $SiO_2$. In addition, the intermediate layer 306 may be transparent or may be translucent or opaque since light beams 140 may not need to be transmitted through the intermediate layer 306. In a particular example, the intermediate layer 306 comprises a material that partially or complete absorbs and/or scatters light, for instance, light that strays from the intended direction of the light beam through the lens 112.

With reference back to FIG. 1, the apparatus 102 is depicted as being positioned between the OE component 120 and the optical transmission medium 130. Generally speaking, the apparatus 102 operates as an interface between the OE component 120 and the optical transmission medium 130. The apparatus 102 may equivalently be termed an optoelectronic bench. In any regard, the apparatus 102 passively aligns the OE component 120 with the optical transmission medium 130, such that light beams 140 emitted and/or received by the optical element 122 on the OE component 120 are precisely aligned with the optical waveguide 134 in the optical transmission medium 130. The alignment of the OE component 120 and the optical transmission medium 130 is passive because the alignment occurs when the mating alignment element 136 of the optical transmission medium 130 mates with the first mating alignment element 104 of the apparatus 102. In this regard, and in contrast with active alignment techniques, the passive alignment techniques disclosed herein generally require less time and effort and are thus less expensive to implement as compared with active alignment techniques.

Although not explicitly depicted in FIG. 1, an anti-reflective coating may be provided on at least one of the surfaces of the top transparent layer 108 and the bottom transparent layer 110 through which the light beam 140 traverses. Thus, for instance, an anti-reflective coating may be provided on the bottom surface 118 of the bottom transparent layer 110, a bottom surface of the top transparent layer 108, a top surface 114 of the top transparent layer 108, a surface of the cavity 116, etc.

The apparatus 102 is depicted as being bonded to the OE component 120 through a plurality of solder bumps 150, which may broadly be interpreted as small amounts of solder that may be formed into any practical shape, such as a ball or a pillar. More particularly, a plurality of bond pads 160 connected to metal traces 162, which are positioned on the bottom surface 118 of the bottom transparent layer 110, are positioned with respect to the lens 112, such that a second set of bond pads 164 on the OE component 120 precisely align with some of the plurality of bond pads 160. As discussed in greater detail herein below, the OE component 120 may be self-aligned with the apparatus 102 through use of the bond pads 160, 164 and the solder bumps 150. The alignment of the bond pads 160 on the apparatus 102 and the bond pads 164 on the OE component 120 enables the optical element 122 on the OE component 120 to also be aligned with the lens 112. According to an example, the OE component 120 is flip chip bonded to the apparatus 102, which refers to a process in which semiconductor devices are electronically connected.

This flip-chip process includes placing an electrical trace and under bump metals on a surface of the OE component 120 and on the surface of the bottom transparent layer 110, i.e., metal trace 162, and then placing an accumulation of solder on the under bump metals on the surface of the OE component 120 and bottom transparent layer 110. The process includes turning the apparatus 102 over, aligning the solder with the electrical traces and under bump metal of the OE component 120, and melting and solidifying the solder bumps to complete the connection. During the melting step, the OE component 120 is brought into alignment with the apparatus 102. The electrical traces may be precisely fabricated on the bottom transparent layer 110 and the OE component 120 through various processes including, but not limited to photolithography.

An example process in which the OE component 120 may be bonded to the apparatus 102 to precisely self-align the optical element 122 with the lens 112 in the apparatus 102 will now be described. In the example process, the solder bumps 150 on bond pads 164 of the OE component 120 are placed in contact with the bond pads 160 on the apparatus 102. At this point, the solder bumps 150 are not yet completely melted. Rather they are in a state so as to cause the bond pads 160, and 164 to stick to the solder bumps 150. Initially, when the OE component 120 is placed near the bottom surface of the apparatus 102 so that the solder bumps 150 come into contact with the bond pads 160, the optical element 122 may not quite be aligned with the lens 112. Alternatively, the solder bumps 150 may initially be provided on the bond pads 160.

With the application of the appropriate amount of heat, the solder bumps 150 will completely melt. The size, shape, and material of the bond pads 160, 164 and the size, shape, and material of the solder bumps 150 are such that the surface tension will bring the bond pads 160, 164 into alignment with respect to each other. In one example, the solder bumps 150 may be approximately 100 micrometers (μm) in diameter.

After the heat is no longer being applied, the melted solder bump 150 material will cool and solidify. This will hold the OE component 120 in place, so that the optical element 122 is properly aligned with the lens 112 in the apparatus 102. Thus, when the optical element 122 emits or detects light, that light will be appropriately directed into or received from the lens 112.

The apparatus 102 may be mated with the optical transmission medium 130 by substantially aligning the optical transmission medium 130 with respect to the apparatus 102 and by moving one or both of the optical transmission medium 130 and the apparatus 102 such that they approach each other. When the optical transmission medium 130 and the apparatus 102 are sufficiently close to each other, the first alignment element 104 on the apparatus 102 is to mate with the mating alignment element 136 on the optical transmission medium 130. In addition, the second alignment element 106 is to mate with another mating alignment element 136 on the optical transmission medium 130. As shown in FIG. 1, the first alignment element 104 and the second alignment element 106 have been depicted as having bases that are relatively wider than tops of the first and second alignment elements 104, 106, i.e., having substantially conical or frustum shapes. Likewise, the mating alignment elements 136 have been depicted as having tapered cross sections. As such, the first alignment element 104 may relatively easily mate with the mating alignment element 136. In addition, the apparatus 102 may be fixedly or removably attached to the optical transmission medium 130 through any suitable attachment mechanisms, such as, friction fitting, adhesives, bonding, latching, etc. The shapes of the mating elements may be selected to initially provide coarse alignment and finally provide fine alignment in all axes.

The apparatus 102 is further depicted as being bonded to interposers 154, which may comprise printed circuit boards (PCBs), flexible boards, etc., through a plurality of solder bumps 150. As also shown, the interposers 154 are depicted as including vias 156 through which electrical current may be communicated. In this regard, the OE system 100 may be implemented as part of an array of OE systems 100.

Although the OE system 100 has been depicted as including a single optical element 122, a single lens 112, and a single optical waveguide 134, it should be understood that the OE system 100 may include any suitable numbers of optical elements 122, lenses 112, and optical waveguides 134. Thus, for instance, the OE component 120 may include a plurality of optical elements 122, the apparatus 102 may include a plurality of lenses 112, and the optical transmission medium 130 may include a plurality of optical waveguides 134, in which respective sets of optical elements 122, lenses 112, and optical waveguides 134 are aligned with respect to each other. An example of such an arrangement is depicted in FIG. 4.

Figure 4:
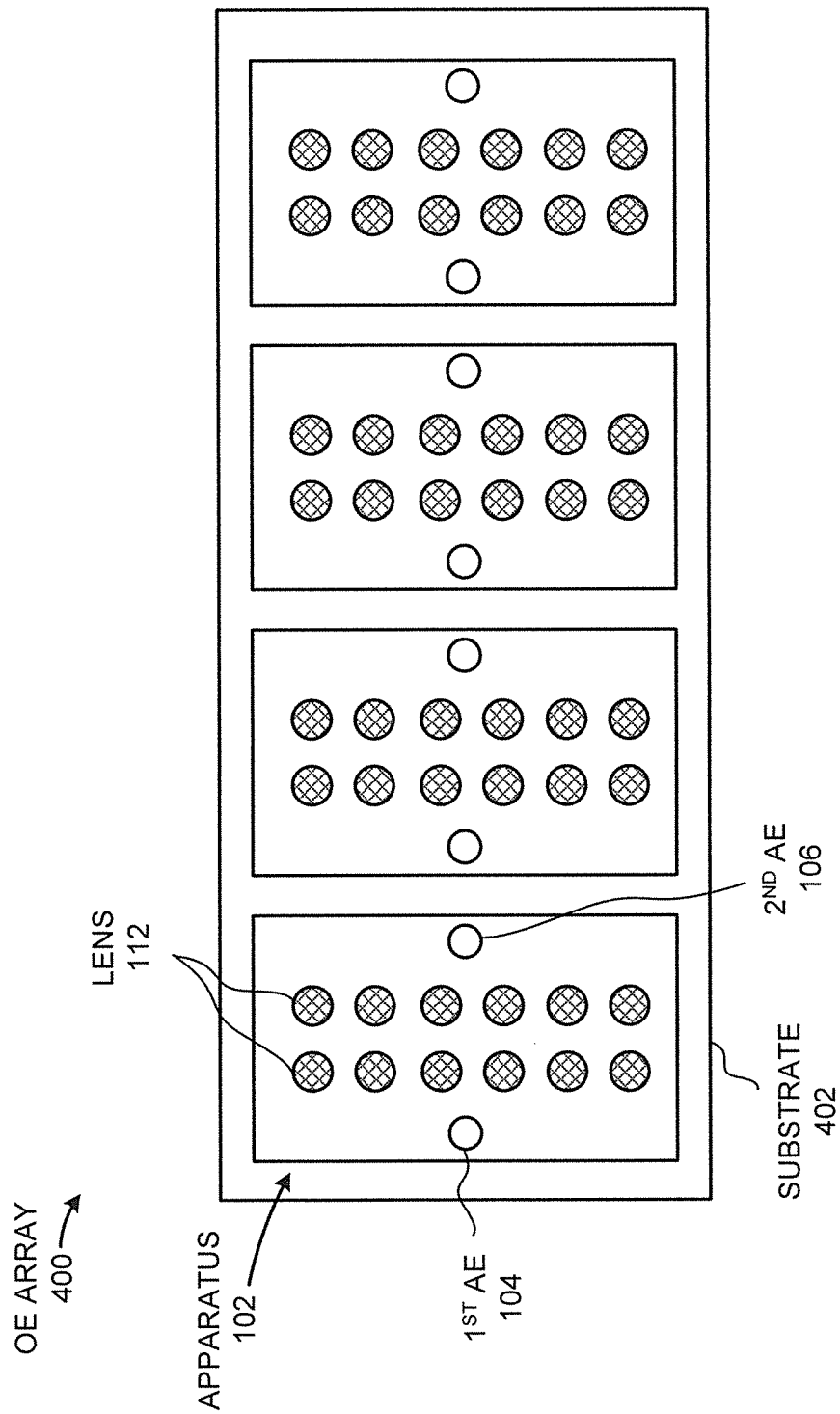
FIG. 4 shows a top view of an optoelectronic array of a plurality of apparatuses depicted in FIG. 1, according to an example of the present disclosure.

FIG. 4, more particularly, shows a top view of an optoelectronic (OE) array 400 of a plurality of apparatuses 102 depicted in FIG. 1, according to an example. Although four apparatuses 102, each including twelve lenses 112, a first alignment element 104, and a second alignment element 106, have been depicted in FIG. 4, it should be understood that the OE array 400 may include any reasonable number of lenses 112 and alignment elements 104, 106 without departing from a scope of the apparatus 102 and OE system 100 disclosed herein. In addition, the apparatus 102 may comprise other shapes, such as, round, square, etc., and the lenses 112 may be positioned in any suitable arrangement. Moreover, the alignment elements 104, 106 may be positioned on the apparatus 102 in any suitable arrangement.

As shown in FIG. 4, the OE array 400 includes a substrate 402 on which a plurality of apparatuses 102 are positioned. The substrate 402 may comprise the interposer 154 depicted in FIG. 1. In addition, OE components 120 may be positioned below each of the apparatuses 102 such that the optical elements 122 of the OE components 120 are positioned beneath the lenses 112 as discussed above with respect to FIG. 1. Moreover, optical transmission media 130 may be positioned on top surfaces of the apparatuses 102 with the mating alignment elements 136 of the optical transmission media 130 mating with the alignment elements 104, 106 of the apparatuses 102. As discussed herein, the optical waveguides 134 are to be passively aligned with the optical elements 122 when the mating alignment elements 136 of the optical media 130 mate with the alignment elements 104, 106 of the apparatus 102, as also shown in FIG. 1.

Figure 5:
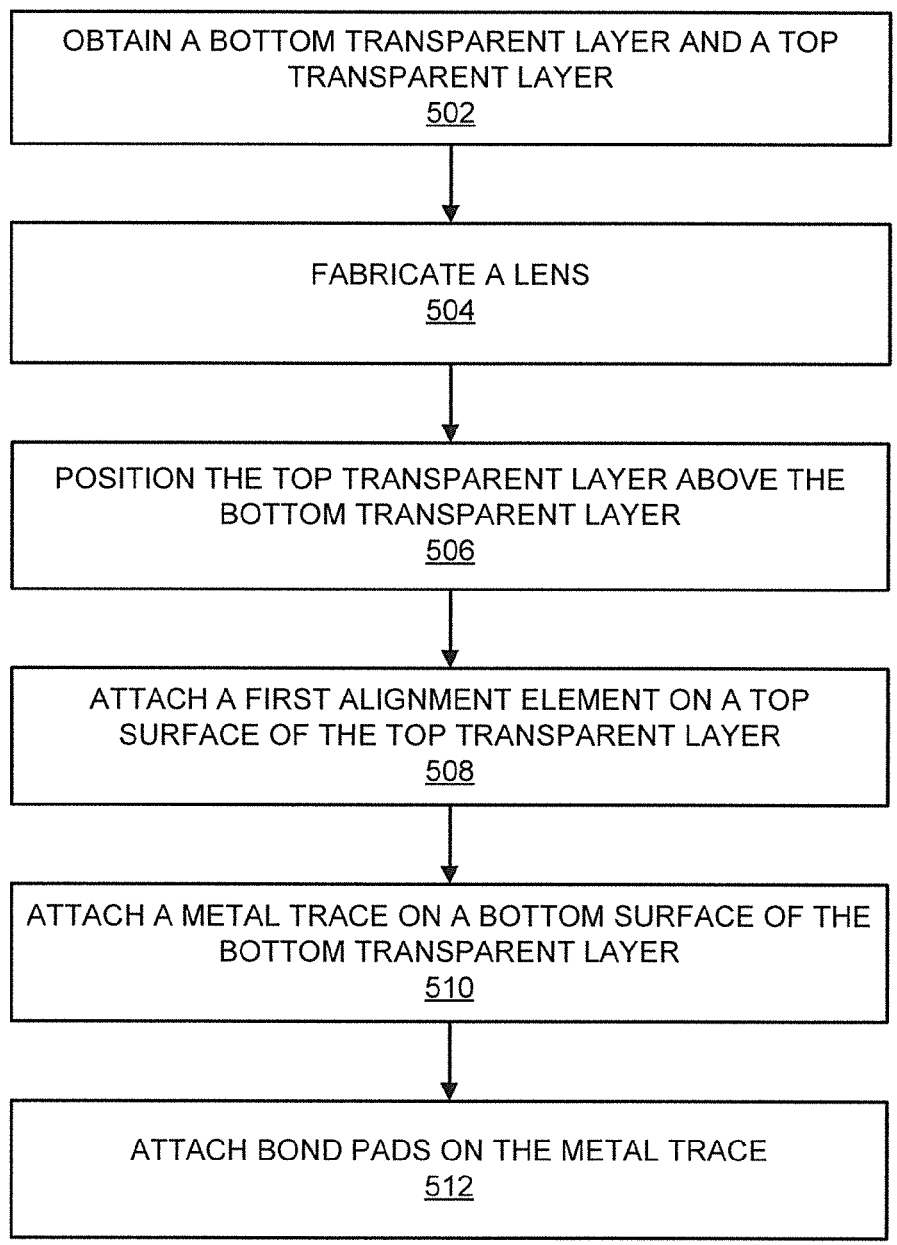
FIG. 5 shows a flow diagram of a method for fabricating an apparatus for use in optoelectronics, according to an example of the present disclosure.

Turning now to FIG. 5, there is shown a flow diagram of a method 500 for fabricating an apparatus for use in optoelectronics, according to an example. It should be understood that the method 500 may include additional processes and that some of the processes described herein may be removed and/or modified without departing from a scope of the method 500. Generally speaking, various processes in the method 500 may include wafer scale processes and precise patterning of the alignment elements 104, 106 and the bond pads 162 relative to the lens 112.

At block 502, a bottom transparent layer 110 and a top transparent layer 108 are obtained. The bottom transparent layer 110 and the top transparent layer 108 may be obtained through fabrication of the bottom transparent layer 110 and the top transparent layer 108. Alternatively, the bottom transparent layer 110 and the top transparent layer 108 may be obtained from a manufacturer or supplier of the layers 108, 110.

At block 504, a lens 112 is fabricated. As discussed above with respect to FIGS. 1 and 3A-3D, the lens 112 may be fabricated on a surface 304 of the top transparent layer 108, a surface 302 of the bottom transparent layer 110, or on an intermediate layer 306. In addition, the lens 112 may be fabricated such that the lens 112 is enclosed in a cavity 116 formed between the top transparent layer 108 and the bottom transparent layer 110.

At block 506, the top transparent layer 108 is positioned above the bottom transparent layer 110. As discussed above with respect to FIGS. 1 and 3A-3D, the top transparent layer 108 may be positioned directly on the bottom transparent layer 110. In this configuration, the top transparent layer 108 may be bonded to the bottom transparent layer 110 through use of any suitable bonding techniques. Alternatively, a lens layer 111 or an intermediate layer 306 may be positioned between the top transparent layer 108 and the bottom transparent layer 110. In this configuration, the top transparent layer 108 and the bottom transparent layer 110 may be bonded to the intermediate layer 306 through use of any suitable bonding techniques. The suitable bonding techniques include, for instance, wafer bonding, adhesive bonding, thermo-compression bonding, etc. In addition or alternatively, however, the relative positions of the top transparent layer 108 and the bottom transparent layer 110 may be maintained after the bonding process.

The term "wafer bond" refers to manufacturing processes that are used to bond thin substrates of similar or dissimilar material to one another. More particularly, the top transparent layer 108 may be bonded to the bottom transparent layer 110 and/or to the intermediate layer 306 through, for instance, adhesive bonding, anodic bonding, fusion bonding, eutectic bonding, etc.

At block 508, a first alignment element 104 is attached to the top surface 114 of the top transparent layer 108. The first alignment element 104 may be attached to the top surface 114 through any of a plurality of fabrication techniques. For instance, the first alignment element 104 may be formed on the top surface 114 through at least one of imprinting, molding, photolithography, deep reactive ion etching, electroplating, etc. Photolithography is a process whereby a pattern is transferred to a layer of photoresist on the substrate. The photoresist serves as a mask. Portions of the substrate not covered by the mask may be removed by deep reactive ion etching.

As another example, the first alignment element 104 may be attached to the top surface 114 through a fabrication operation selected from a group of fabrication operations consisting of electroplating a post, forming a hole through a block of material, such as SU-8, electroplating a block of material and etching a hole into the block material, etc. The first alignment element 104 may also be formed through application of additional operations, such as, reflow, thermal oxidization and wet etch to smooth out sharp corners, oxidation or coating with materials to at least one of increase the rigidity of and reduce friction on the first alignment element 104, etc.

A second alignment element 106 may be formed at block 508 in any of the matters discussed above with respect to formation of the first alignment element 104. In addition, the first alignment element 104 and the second alignment element 106 may comprise the same shapes or may have different shapes with respect to each other, for instance, as discussed above with respect to FIGS. 1 and 2A-2C. In this regard, for instance, the first alignment element 104 may comprise a pillar and the second alignment element 106 may comprise a female-type of connector having an opening.

At block 510, a metal trace 162 is attached to a bottom surface 118 of the bottom transparent layer 110. The metal trace 162 may be attached to the bottom surface 118 through any suitable metal patterning and/or adhesion technique.

At block 512, a plurality of bond pads 160 are attached to the metal trace 162. The bond pads 160 may be attached through formation of the bond pads 160 on the metal trace 162 through any suitable process, such as, photolithography and metallization. In addition, the bond pads 160 may be formed at particular sites on the metal trace 162 to cause the optical element 122 to be precisely aligned with the lens 112 when the OE component 120 is attached to the bond pads 160, as discussed in greater detail herein. By way of example, masks may be used to form the locations of the bond pads 160. These masks may be properly aligned with respect to the lens 112 so that the bond pads 160 are appropriately spaced in relation to the lens 112. This appropriate spacing, which corresponds to the bond pad 164 spacing on the OE component 120, allows for proper alignment of the optical element 122 to the lens 112.

Following fabrication of the apparatus 102, the bond pads 164 of the OE component 120 may be attached to the bond pads 160 and the optical transmission medium 130 may be connected to the first and second alignment elements 104, 106, as discussed above with respect to FIG. 1. For instance, the OE component 120 may be flip-chip bonded to the apparatus 102 in a manner that the OE component 120 is self-aligned with the lens 112 in the apparatus 102. As also discussed above, the optical element 122 on the OE component 120 may relatively easily be aligned with the lens 112 and the optical transmission medium 130 may passively be aligned with the lens 112 through mating of the first and second alignment elements 104, 106 and the mating alignment elements 136.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An apparatus for use in optoelectronics, said apparatus comprising:
   a bottom transparent layer;
   a top transparent layer having a top surface;
   a lens sandwiched between the bottom transparent layer and the top transparent layer, wherein the lens is to direct a light beam through a section of the top transparent layer; and
   a first alignment element attached to the top surface of the top transparent layer, wherein the first alignment element is positioned outside of the section of the top transparent layer through which the light beam is directed from the lens, and wherein the first alignment element is to mate with a mating alignment element on an optical transmission medium.

2. The apparatus according to claim 1, wherein the bottom transparent layer comprises a bottom surface, the apparatus further comprising:
a plurality of bond pads positioned beneath the bottom surface of the bottom transparent layer upon which an optoelectronic component having an optical element is to be attached, wherein the optical transmission medium is to be passively aligned with the optical element through the lens when the first alignment element is mated with the mating alignment element on the optical transmission medium and the optoelectronic component is attached to the plurality of bond pads.

3. The apparatus according to claim 2, wherein the plurality of bond pads are positioned at predetermined and aligned locations with respect to the lens.

4. The apparatus according to claim 1, wherein the bottom transparent layer and the top transparent layer comprise glass and wherein the top surface is substantially planar.

5. The apparatus according to claim 1, further comprising:
an enclosed cavity formed between the bottom transparent layer and the top transparent layer, wherein the lens is positioned within the enclosed cavity.

6. The apparatus according to claim 5, wherein the lens is one of formed on a top surface of the bottom transparent layer, formed on a bottom surface of the top transparent layer, and formed on a separate substrate.

7. The apparatus according to claim 1, further comprising:
a lens layer, wherein the lens is formed in a cavity of a lens layer, and wherein the lens layer and the cavity are enclosed by the bottom transparent layer and the top transparent layer.

8. The apparatus according to claim 1, further comprising:
an intermediate layer, wherein the intermediate layer is sandwiched between the bottom transparent layer and the top transparent layer, and wherein the intermediate layer is formed of a material that at least partially absorbs and/or scatters light.

9. A method for fabricating an apparatus for use in optoelectronics, said method comprising:
obtaining a bottom transparent layer and a top transparent layer;
fabricating a lens;
positioning the top transparent layer above the bottom transparent layer, wherein the lens is fabricated to be positioned within a cavity formed between the bottom transparent layer and the top transparent layer, and wherein the lens is to direct a light beam through a section of the top transparent layer; and
attaching a first alignment element on a top surface of the top transparent layer in a position that is precisely offset with respect to the lens, wherein the first alignment element is positioned outside of the section of the top transparent layer through which the light beam is directed from the lens, and wherein the first alignment element is to mate with a mating alignment element on an optical transmission medium.

10. The method according to claim 9, further comprising:
attaching a metal trace to a bottom surface of the bottom transparent layer; and
attaching a plurality of bond pads on the metal trace, wherein the plurality of bond pads are to be attached to an optoelectronic component having an optical element.

11. The method according to claim 10, wherein attaching the plurality of bond pads on the metal trace further comprises aligning the plurality of bond pads with respect to the lens to cause the optical element in the optoelectronic component to be precisely aligned with the lens when the optoelectronic component is attached to the plurality of bond pads.

12. The method according to claim 9, wherein positioning the top transparent layer above the bottom transparent layer further comprises bonding the top transparent layer to the bottom transparent layer either directly or through an intermediate layer.

13. The method according to claim 9, wherein attaching the first alignment element further comprise forming the first alignment element through a forming technique selected from the group consisting of imprinting, molding, photolithography, deep reactive ion etching, and electroplating.

14. An optoelectronic system comprising:
an apparatus having,
a bottom transparent layer;
a top transparent layer having a top surface;
a lens sandwiched between the bottom transparent layer and the top transparent layer, wherein the lens is to direct a light beam through a section of the top transparent layer; and
a first alignment element attached to the top surface of the top transparent layer, wherein the first alignment element is positioned outside of the section of the top transparent layer through which the light beam is directed from the lens, and wherein the first alignment element is to mate with a mating alignment element on an optical transmission medium;
a plurality of bond pads positioned beneath the bottom surface of the bottom transparent layer; and
an optoelectronic component attached to the plurality of bond pads, wherein the first alignment element is to mate with a mating alignment element on an optical transmission medium, and wherein the optical transmission medium is to be passively aligned with an optical element of the optoelectronic component through the lens when the first alignment element is mated with the mating alignment element on the optical transmission medium.

15. The optoelectronic system according to claim 14, wherein the apparatus comprises an enclosed cavity formed between the bottom transparent layer and the top transparent layer, and wherein the lens is positioned within the enclosed cavity.

16. The apparatus according to claim 1, wherein the first alignment element is further positioned sufficiently outside of the section of the top transparent layer to prevent any light directed through the lens from being directed onto the first alignment element.

17. The optoelectronic system according to claim 14, wherein the first alignment element is further positioned sufficiently outside of the section of the top transparent layer to prevent any light directed through the lens from being directed onto the first alignment element.

* * * * *